United States Patent [19]

Pernyeszi

[11] 4,170,740
[45] Oct. 9, 1979

[54] HIGH VOLTAGE SWITCH AND CAPACITIVE DRIVE

[75] Inventor: Joseph Pernyeszi, Fairfield, Conn.

[73] Assignee: International Telephone and Telegraph Corporation, Nutley, N.J.

[21] Appl. No.: 880,833

[22] Filed: Feb. 24, 1978

[51] Int. Cl.² ............... H03K 17/16; H03K 17/60
[52] U.S. Cl. .................... 307/251; 307/216; 307/246; 307/257; 307/282; 179/81 R
[58] Field of Search ............ 307/216, 246, 251, 257, 307/282

[56] References Cited

U.S. PATENT DOCUMENTS

| | | | |
|---|---|---|---|
| 3,657,569 | 4/1972 | Froeschle | 307/282 X |
| 4,031,410 | 6/1977 | Kikuchi | 307/216 X |
| 4,052,623 | 10/1977 | Loberg | 307/251 |
| 4,128,811 | 12/1978 | Englund | 307/216 X |

*Primary Examiner*—John S. Heyman
*Attorney, Agent, or Firm*—John T. O'Halloran; Jeffrey P. Morris

[57] ABSTRACT

A high voltage capacitive drive circuit for coupling a dc or pulsed dc input voltage from a control input to a relay having a high voltage output circuit is described in which the output of the high voltage relay circuit is electrically isolated from the control input thereto without the use of optical couplers. The combined capacitive drive circuit and high voltage switch circuit of the present invention may be integrated on a single silicon chip using conventional isolation fabrication techniques to provide good isolation between the control input and the output of the high voltage relay circuit. A pair of matched capacitive couplers are driven in a push-pull mode to pump electrical charge to a floating control circuit which turns on the high voltage relay contact. An exclusive OR circuit prevents high voltage signals on the contact terminals from inadvertently turning the contact ON or OFF by being responsive only to out of phase inputs. The described high voltage switch and capacitively coupled drive circuit is suitable for fabrication on a single semiconductor chip.

15 Claims, 2 Drawing Figures

HIGH VOLTAGE SWITCH AND CAPACITIVE DRIVE

BACKGROUND OF THE INVENTION

1. Field of the Invention

The present invention relates to the field of integrated circuits and more particularly to a high voltage switch and capacitively coupled drive circuit for providing a high voltage relay with a controlled input which is suitable for fabrication on a single silicon chip. The present invention also relates to the field of solid state telephone line circuits in which integrated circuit DC relays and capacitively coupled drive circuitry is required to couple DC input voltages to high voltage switches while maintaining isolation between the high voltage switch and the controlled DC input to the switch.

2. Description of the Prior Art

Prior art high voltage switches for deriving a high voltage output signal from a DC input in which the switch portion of the circuit is required to be fabricated on an integrated circuit silicon chip MOS configuration, for example, must maintain electrical isolation between the solid state relay contacts of the high voltage switch and the control input by which a DC or pulsed DC voltage is coupled to the circuit. In the prior art, this electrical isolation has been achieved by means of optical couplers or transformers. Neither optical couplers nor transformer circuitry can be combined with the high voltage switch on a single integrated circuit chip using current known integrated circuit fabrication techniques for MOS integrated circuit design. Isolation between the solid state relay output of the high voltage switch and its control input is essential in an integrated circuit configuration since the high voltage at the relay output would destroy the input logic portion of the circuit, causing undesired switching of the relay. Additionally, the isolation of the output terminals of the high voltage switch and its control input is particularly suitable in applications such as telephone line circuit configurations in which a floating ground at the switch is required.

As aforementioned, optical couplers must be manufactured separately and put together as an assembly rather than being fabricated on a single silicon chip for the transmission of signals between two circuits which must be electrically isolated from each other. Such optical couplers typically include a light emitting diode and photosensitive transistors configured so that an input voltage is applied to the LED terminals. The resulting LED light output then turns on the photosensitive transistors thereby producing an electrically isolated output voltage at the phototransistor output from the input voltage. Such optical couplers are well known and are further described in Modern Microelectronics by Research and Education Association, Second Printing 1974, at pages 312 and 313 thereof.

The present invention may be advantageously utilized in MOS circuitry fabricated in accordance with well known dielectric isolation processes such as are described in greater detail, for example, in the aforementioned Modern Microelectronics, Second Printing 1974, at pages 425 thru 434. A particular known fabrication technique in which V shaped curves are etched into the surface of the metal oxide semiconductor dice (VMOS) is a well known fabrication technique in which the vertical difference between two diffusion layers (the channel length) is maintained short, ie., a few microns, is one exemplary MOS logic technology which is suitable for fabricating the circuit of the present invention and in which technology the prior art optical couplers can not be integrated. Since these fabrication techniques are well known, they will not be described in detail herein.

The disclosed circuit without prior art optical couplers or transformers can also be fabricated in large scale integrated circuits (LSI) together with other devices and is particularly suitable and cost effective for use in such LSI circuits which are designed to be manufactured in large quantity, such as the signal generator portion of telephone line circuits of the type described by the copending U.S. patent application Ser. No. 773,713 of Robert Treiber, filed March 2, 1977 and assigned to the same assignee as the present application.

SUMMARY OF THE INVENTION

A combined high voltage switch and capacitively coupled drive circuit for an integrated circuit relay is described in which isolation of the control input voltage from the high voltage output of the relay is achieved by means of a pair of matched capacitors and an exclusive OR gate which is responsive only to an out-of-phase drive input. The matched coupling capacitors which are driven in a push-pull configuration provides a signal at the output of a logical gate which, when applied to the gates of a pair of MOS transistors turning them ON, provides a high voltage switch at the outputs thereof. The exclusive OR gate is not responsive to an in phase drive input, hence the relay is not subject to inadvertent switching caused by failure of isolation of the switch output from the control input. The combined switch and capacitive drive circuit may be fabricated in its entireity on a single silicon chip in VMOS configuration without the need for optical couplers or transformers.

DESCRIPTION OF THE PREFERRED EMBODIMENT

Figure 1:
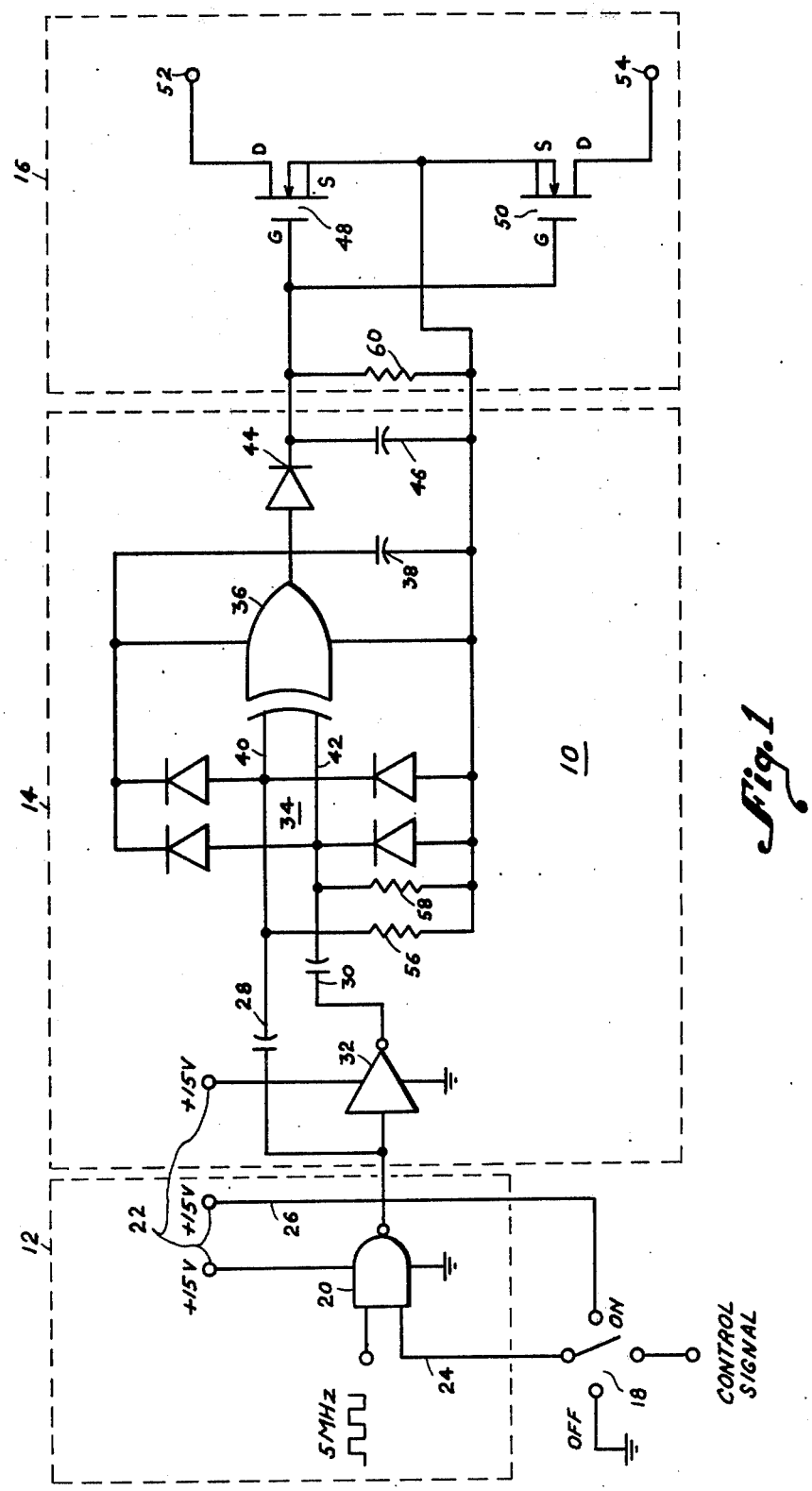
FIG. 1 is a schematic of a high voltage switch and capacitively coupled drive circuit in accordance with the present invention.

Referring to FIG. 1, the combined high voltage switch and capacitively coupled drive circuit is illustrated generally at 10. A 5 MHz clock or other suitable signal is coupled through a NAND gate in input logic 12 and drives a pair of matched capacitors in the capacitively coupled drive circuit 14 to couple an applied DC voltage at the applied clock rate to the high voltage switch 16 portion of the circuit. Matched capacitors 28 and 30 are typically about ten picofarads with time constants of about 10−4. Input logic 12, capacitively coupled drive 14 and high voltage switch 16 may be configured on a single silicon chip to which the 5 MHz clock is applied by a switch 18 being in the ON position or to which a pulsed DC signal at the control signal input of switch 18 may be applied, which for example, may be at frequency of 100 Hz or less. NAND gate 20 has coupled to one of its logical inputs the 5 MHz clock and has coupled at its other logical input 24 a signal which is either low (zero volts) or high (15 volts) to turn the switch 16 OFF or ON respectively. A 15 volt DC source 22 is coupled to NAND gate 20 at the appropriate voltage input for the device used. A pulsed switching operation at a control signal frequency is obtained at the pulse control signal input to switch 18.

When switch 18 is in the ON position, the 15 volts DC applied at 22 is coupled internally in the NAND gate to logical input 24 of NAND gate 20. The 15 volts coupled to NAND gate 20 on line 26, the 5 MHz clock rate appears at the output of NAND gate 20 and is coupled to a pair of matched capacitors 28 and 30, with the drive voltage being coupled directly to matched capacitor 28 (in-phase) and inverted by inverter 32 before being coupled (out of phase) to the other matched capacitor 30. Matched coupling capacitors 28 and 30 with values of the 10 pf range serve to capacitively couple the applied input to logic 12 at a voltage level determined by DC source 22 to a diode bridge circuit 34 including four diodes configured as illustrated. This effectively decouples the input DC from the voltage on the diode bridge side of capacitors 28 and 30, thereby performing the function previously performed by an optical coupler, ie., electrical isolation. The 15 volts DC applied to NAND gate 20 and inverter 32 which is coupled to the diode bridge 34 is also coupled to an exclusive OR gate 36 which is powered by the output of the diode bridge 34. Capacitor 38 filters the input applied to exclusive OR gate 36 by the diode bridge 34, providing a full wave rectifier fed by an input square wave at 5 MHz clock rate.

A DC voltage is provided at the gate electrodes of the high voltage switch 16 as follows: The output of exclusive OR 36 is high (ON) only when the two logical inputs 40 and 42 thereto from the diode bridge 34 are out of phase ie., when one input is high (logic 1) and the other input is low (logic 0). When the output of exclusive OR 36 is high (logic 1), this output will be coupled through diode 44, charge capacitor 46 and turn ON high voltage transistors 48 and 50. This serves to provide a low resistance path between output terminals 52 and 54 at the drains of transistors 48 and 50 respectively. Transistors 48 and 50 may comprise, for example, VMOS transistors Part No. VMP 22, having gate source and drain connections as illustrated, or their equivalent, manufactured by Siliconex Corp., which have a 90 volt capability. This capability can be increased to a 400 to 500 volt output by variation of transistor parameters and the 90 volt example is by way of illustration only.

The operation of the high voltage switch and capacitive drive circuit 10 will now be explained for the case in which the input on line 24 to NAND gate 20 is low (0 volts) ie., when switch 18 is in the OFF position. For this condition, the output of NAND gate 20 is an unclocked 15 volts DC, which is blocked by capacitors 28 and 30. The residual charge of capacitors 28 and 30 is dissipated in resistors 56 and 58 respectively as leakage current. Capacitor 46 is discharged through resistor 60, resulting in a gate to source voltage applied to transistors 48 and 50 of 0 volts, which turns transistors 48 and 50 OFF and which provides a high resistance path between terminals 52 and 54 at the drains of transistors 48 and 50 respectively.

Any current which may be coupled to capacitors 28 and 30 from the output terminals 52 and 54 of transistors 48 and 50 will result in the same voltage shift across capacitors 28 and 30, which provides in-phase signals at the input terminals 40 and 42 of exclusive OR 36. Since as aforementioned, exclusive OR gate 36 will only have an output in response to out-of-phase inputs, the exclusive OR gate 36 is insensitive to the in-phase signal applied at inputs 40 and 42 thereto. Thus it is apparent that the output voltage appearing on terminals 52 and 54 of the high voltage switch will have no effect on the operation of the switch, which is turned ON only by the out-of-phase drive. Thus, the operation of exclusive OR gate 36 maintains electrical isolation of the output voltage of switch 16 for all voltages below the break-down limit of transistors 48 and 50 and of capacitors 28 and 30, which as aforementioned may be within the range of 400 to 500 volts. Since all the active components may comprise MOS transistors which are fabricable in accordance with well known fabrication techniques, using conventional dielectric isolation processes, the entire circuit is implementable on a single silicon chip. An isolated (from ground) floating switched DC voltage is thus obtained at terminals 52 and 54.

Figure 2:
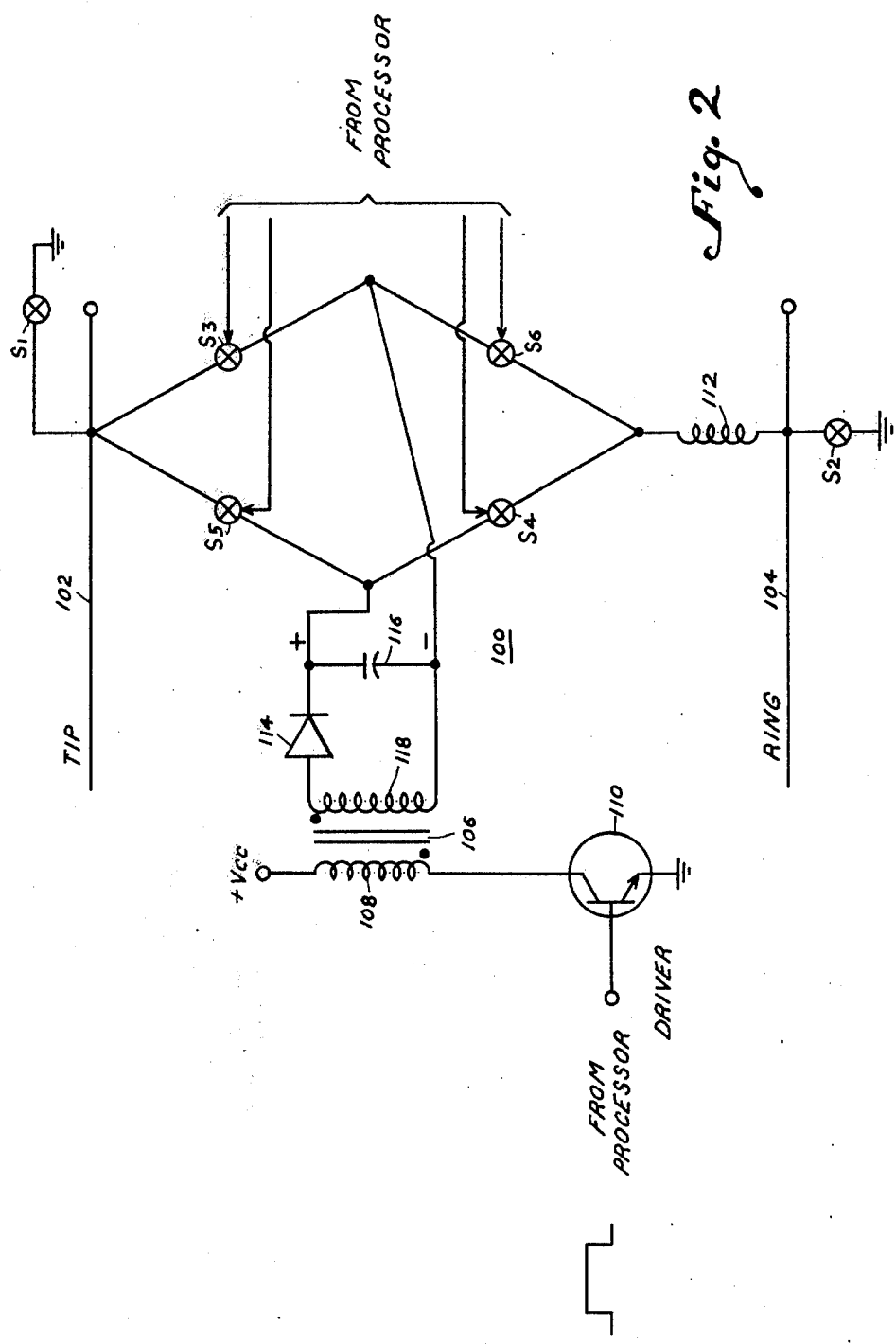
FIG. 2 is a simplified circuit diagram of a signal generator of the floating isolated bridge type for use in a telephone line circuit in which the present invention may be utilized.

Referring now to FIG. 2, a floating isolated bridge circuit for switching the output on the secondary of a telephone line circuit is illustrated at 100. This circuit is useful as a programmable signal generator in a telephone subscriber line circuit for interfacing analog telephone lines or trunks to a digital switching system of the type described in detail in the aforementioned copending U.S. patent application Ser. No. 733,713 and to which reference may be made for details of the operation of the line circuit and programmable signal generator. For purpose of the present description, the incorporation of the switches of the present invention into the illustrated signal generator is sufficient. In such a line circuit arrangement, incoming analog signals such as appear on the tip and ring lines 102 and 104 are sensed, digitized, processed by a microprocessor to derive a modulated drive signal from the digitized sensed voltage, which is then coupled back to the programmable signal generator to generate various signals, such as telephone ringing voltage. The details of the operation of the aforementioned line circuit ar described in copending application Ser. No. 733,713 which may be referred to, however, it is sufficient for an understanding of a typical application of the present invention that the programmable signal generator shown generally at 100 must be isolated from the remainder of the line circuit (not shown) by means of a transformer such as ferrite transformer 106. Since the magnitude of the signal generated by a programmable signal generator is determined by input control signals derived from a microprocessor, signal generator 100 is commonly described as a programmable signal generator.

For a given value of voltage coupled to the primary 108 of transformer 106 by a drive transistor 110 of a drive circuit have a base drive derived from a microprocessor such that the base drive has a variable pulse duration on the order of 50 to 100 KHz for the generation of a fixed DC voltage on the tip and ring lines 102 and 104. The pulse duration of the base drive applied to transistor 100 is varied by the microprocessor in accordance with sensed load changes on tip and ring lines 102 and 104 which are sensed in the line circuit and utilized by the microprocessor to vary the pulse duration of the pulse drive on the base of transistor 110 to enable, for example, the detection of changes in hook status of a telephone subscriber.

A number of switches S1, S2, S3, S4, S5 and S6 are utilized in such a signal generator. Each of switches S1 through S6 may comprise a high voltage switch and capacitively coupled drive circuit in accordance with the present invention described with reference to FIG. 1, with the control signal input illustrated by switch 18 of FIG. 1 being provided for switches S3 thru S6 by switching control signals from the microprocessor at the control inputs of the switches. Switches S1 and S2 may be utilized to ground either side of the line for test purposes and inductance 112 serves to isolate the relatively low impedance signal generator from the line.

Operationally, primary 108 stores energy in accordance with the relationship $E=\frac{1}{2}L\ i^2$. When transistor 110 is ON (the indicated positive polarity dots become negative polarity) diode 114 does not conduct. When transistor 110 is OFF diode 114 conducts, charging shunt capacitor 116 and transferring the energy stored in primary 108 to the secondary 118 ie., to capacitor 116. Energy transfer from the primary to the secondary of the transformer 106 is controlled by the switching of tansistor 110 while the amount of energy transferred (the effective output voltage) is controlled by the duty cycle of the switching of transistor 110, which in turn is controlled by the pulse duration modulated signal applied to the base thereof.

Switches S3, S4, S5 and S6 of the present invention, which may comprise VMOS switches of the type described with reference to FIG. 1 are driven by isolated transformer coupled microprocessor controlled switching pulses at their control inputs. An ac signal is generated by means of a half-wave rectified signal and the switches S3 through S6. When switches S3 and S4 are ON, switches S5 and S6 are OFF, and vice versa. Illustratively, when switches S3 and S4 are ON the negative polarity from capacitor 116 is coupled to the tip line 102 and the positive polarity to the ring line 104. It is important to maintain the floating bridge configuration so that isolation of the outputs of switches S3 through S6 from the control inputs thereto is maintained.

While the present invention has been described in connection with a preferred embodiment thereof, it is to be understood that additional embodiments, modifications and applications which will become obvious to those skilled in the art are included within the spirit and scope of the invention as set forth by the claims appended thereto.

I claim:
1. A solid state switch comprising:
input logic means for selectively coupling an input voltage to an output of said input logic means at a predetermined frequency;
means for capacitively coupling said predetermined frequency voltage from said input logic means to a pair of logic inputs, such that said predetermined frequency voltage on one of said logic inputs is out of phase with the other of said predetermined frequency voltage on the other of said logic inputs;
gate means coupled to said logic inputs and responsive to the voltages on said logic inputs and having an output when the voltages on said logic inputs are out of phase; and
switching means coupled to and responsive to the output of said gate means for providing either a high voltage output or a low resistance conductive path at the output thereof, in accordance with the output of said gate means, such that said high voltage output is electrically isolated from said input logic means.

2. A solid state switch in accordance with claim 1 wherein said input logic means comprises a gating circuit for coupling a DC voltage from the input thereof to the output thereof at said predetermined frequency.

3. A solid state switch in accordance with claim 2 wherein said means for capacitively coupling said voltage comprises:
a first capacitance coupled to the output of said input logic means and to one of said logic inputs to said gate means;
an inverter coupled to the output of said input logic means and to a second capacitance, the output of said second capacitance being coupled to the other side of said logic inputs of said gate means, such that the outputs of said first and second capacitances are out of phase with each other.

4. A solid state switch in accordance with claim 3 further comprising:
diode bridge means coupled to the outputs of said first and second capacitances for maintaining predetermined voltage levels at the logic inputs to said gate means.

5. A solid state switch in accordance with claim 3 wherein said gate means includes an exclusive OR gate.

6. A solid state switch in accordance with claim 3 wherein said switching means comprises a pair of switching transistors switched ON by the presence of the output of said gate means and OFF by the absence of the output of said gate means.

7. A solid state switch in accordance with claim 6 wherein said switching transistors are MOS transistors having the gates thereof coupled to the output of said gate means and for providing either a high or low resistance path between the drains thereof in response to the presence of an output from said gate means.

8. A solid state switch in accordance with claim 7 wherein said switching transistors are VMOS transistors.

9. A solid state switch in accordance with claim 3 wherein said input logic means, said means for capacitively coupling said predetermined frequency voltage, said gate means and said switching means are comprised on a single silicon chip.

10. In a telephone subscriber circuit, a signal generator for generating an electrically isolated output voltage, including signal isolation means having a plurality of solid state switches, each of said switches being coupled to a source of control signals at a control input thereof, wherein each of said solid state switches comprises:
input logic means having a control input for coupling a voltage to an output of said input logic means at a predetermined frequency;
means for capacitively coupling said predetermined frequency voltage from said input logic means to a pair of logic inputs, such that said predetermined frequency voltage on one of said logic inputs is of different phase than the phase of the voltage on the other of said logic inputs;
gate means coupled to said logic inputs and responsive to the voltages on said logic inputs and having an output when the voltages on said logic inputs are out of phase; and
switching means coupled to and responsive to the output of said gate means for providing either a high voltage output or a low resistance conductive path at the output thereof, in accordance with the output of said gate means, such that said high voltage output is electrically isolated from said input logic means.

11. In a telephone subscriber circuit having a plurality of improved solid state switches in accordance with claim 10 wherein said means in each of said switches for capacitively coupling said voltage comprises:
 a first capacitance coupled to the output of said input logic means and to one of said logic inputs to said gate means; and
 an inverter coupled to the output of said input logic means and to a second capacitance, the output of said second capacitance being coupled to the other of said logic inputs to said gate means, such that the outputs of said first and second capacitances are out of phase with each other.

12. In a telephone subscriber circuit having a plurality of improved solid state switches in accordance with claim 11 wherein said gate means in each of said switches includes an exclusive OR gate.

13. In a telephone subscriber circuit having a plurality of improved solid state switches in accordance with claim 12 wherein said switching transistors in each of said switches are MOS transistors having the gates thereof coupled to the output of said gate means and for providing either a high or low resistance path between the drains thereof in response to the output from said gate means.

14. In a telephone subscriber circuit having a plurality of improved solid state switches in accordance with claim 13 wherein said switching transistors in each of said switches are VMOS transistors.

15. In a telephone subscriber circuit having a plurality of improved solid state switches in accordance with claim 11 wherein in each of said switches said input logic means, said means for capacitively coupling said predetermined frequency voltage, said gate means and said switching means are comprised on a single silicon chip.

* * * * *